(12) United States Patent
Ahn et al.

(10) Patent No.: US 7,531,779 B2
(45) Date of Patent: May 12, 2009

(54) CMOS IMAGE DEVICE HAVING HIGH LIGHT COLLECTION EFFICIENCY AND METHOD OF FABRICATING THE SAME

(75) Inventors: Yu-Jin Ahn, Seoul (KR); Young-Hoon Park, Suwon-si (KR); Jae-Ku Lee, Hwaseong-si (KR); June-Taeg Lee, Suwon-si (KR); Sung-Won Doh, Suwon-si (KR); Bum-Suk Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 772 days.

(21) Appl. No.: 11/065,892

(22) Filed: Feb. 25, 2005

(65) Prior Publication Data

US 2005/0200734 A1 Sep. 15, 2005

(30) Foreign Application Priority Data

Mar. 10, 2004 (KR) ...................... 10-2004-0016098

(51) Int. Cl.
*H01L 27/00* (2006.01)
(52) U.S. Cl. .................. 250/208.1; 250/214.1; 257/432
(58) Field of Classification Search .............. 250/208.1, 250/214.1; 257/432
See application file for complete search history.

(56) References Cited

U.S. PATENT DOCUMENTS 6,734,031 B2 * 5/2004 Shizukuishi ................. 438/22

FOREIGN PATENT DOCUMENTS

| JP | 2002033466 | 1/2002 |
|---|---|---|
| JP | 2002-246578 | 8/2002 |
| KR | 2000-0075371 | 12/2000 |
| KR | 2001-0112737 | 12/2001 |

OTHER PUBLICATIONS

Korean Intellectual Property Office, Korean Patent Abstract for publication No. 2002-0075371.
Korean Intellectual Property Office, Korean Patent Abstract for publication No. 2001-0112737.
esp@cenet—Document Bibliography and Abstract for publication No. 2002033466.

* cited by examiner

*Primary Examiner*—Seung C Sohn
(74) *Attorney, Agent, or Firm*—F. Chau & Associates, LLC

(57) ABSTRACT

A CMOS image device comprises a semiconductor substrate having a photo diode region formed therein, an inner lens formed at a position corresponding to the photo diode region on the semiconductor substrate, and an auxiliary lens formed on the inner lens along a surface of the inner lens, wherein the auxiliary lens has a same index of refraction as the inner lens.

20 Claims, 6 Drawing Sheets

CMOS IMAGE DEVICE HAVING HIGH LIGHT COLLECTION EFFICIENCY AND METHOD OF FABRICATING THE SAME

CROSS REFERENCE TO RELATED APPLICATION

This application claims priority to Korean Patent Application No. 2004-16098, filed on Mar. 10, 2004, which is incorporated herein in its entirety by reference.

1 Technical Field

The present disclosure relates to an image device and a method of fabricating the same, and more particularly, to an image device comprising a dual lens structure capable of improving light collection efficiency, and a method of fabricating the same.

2 Discussion of Related Art

Generally, image devices convert optical images into electrical signals. Such image devices may include charge coupled devices (CCD) and CMOS image devices. CCDs include, for example, a plurality of MOS capacitors. The MOS capacitors are operated by moving charges (carriers) generated by light. CMOS image devices include, for example, a plurality of unit pixels and a CMOS logic circuit. The CMOS logic circuit controls output signals of the unit pixels.

Describing the CMOS image device in detail, a pixel array region includes a photo diode for sensing light and transistors for processing charges generated by the photo diode. A micro-lens for collecting light is disposed above the photo diode in the pixel array region. The micro-lens is provided to improve a fill factor and light collection efficiency. Typically, the micro-lens can be formed by a reflowing process of a photosensitive pattern. However, even though the micro-lens is provided with image devices, there exists a limitation in collecting light from an oblique angle.

An inner lens is provided between the micro-lens and the photo diode region as disclosed in U.S. Pat. No. 5,796,154. The inner lens introduced in U.S. Pat. No. 5,796,154 is formed of the same photosensitive material as the micro-lens. However, the technology of forming the inner lens of the photosensitive material requires extra process steps because another photosensitive layer is formed between the photo diode region and the micro-lens.

According to U.S. Pat. No. 6,171,885, an inner lens is formed as a passivation layer. The inner lens in this disclosure is formed of a passivation layer, for example, a silicon nitride layer, on a planarized layer covering the photo diode region. In forming the inner lens, a passivation layer is formed on the planarized layer. A photosensitive pattern is formed on the passivation layer. The photosensitive pattern has a curvature for defining the inner lens to be formed later. Then, the passivation layer is dry-etched into the shape of the photosensitive pattern to form the inner lens.

However, the process of dry-etching the passivation layer to form the inner lens is time dependent. Thus, if the etching time is not controlled precisely, process failures such as the deterioration of the inner lens shape may occur. In other words, if the passivation layer is underetched, the inner lens cannot have a desired curvature radius. If the passivation layer is overetched, the inner lens is reduced in size, and cannot function as a light collecting lens. There exists, therefore, a need to improve light collecting efficiency by precisely controlling the shape of the inner lens.

SUMMARY OF THE INVENTION

In one exemplary embodiment of the present invention, a CMOS image device comprises a semiconductor substrate having a photo diode region formed therein, an inner lens formed at a position corresponding to the photo diode region on the semiconductor substrate, and an auxiliary lens formed on the inner lens along a surface of the inner lens, wherein the auxiliary lens has a same index of refraction as the inner lens.

In another exemplary embodiment of the present invention, a CMOS image device comprises a semiconductor substrate having a photo diode region formed therein, an interlayer insulating layer formed on the semiconductor substrate, an inner lens formed on the interlayer insulating layer to correspond to the photo diode region, an auxiliary lens formed on the inner lens and the interlayer insulating layer, wherein the auxiliary lens has a same index of refraction as the inner lens, and a micro-lens formed on the auxiliary lens for corresponding to at least a portion of the inner lens.

In still another exemplary embodiment of the present invention, a method of fabricating a CMOS image device comprises forming a photo diode region on a portion of a semiconductor substrate, forming an interlayer insulating layer on the semiconductor substrate, forming an inner lens on a portion of the interlayer insulating layer to correspond to the photo diode region, and forming an auxiliary lens on the inner lens, wherein the auxiliary lens comprises a layer having a same index of refraction as the inner lens.

In another exemplary embodiment of the present invention, a method of fabricating a CMOS image device comprises forming a photo diode region on a portion of a semiconductor substrate, forming an interlayer insulating layer on the semiconductor substrate, wherein the interlayer insulating layer has a metal interconnection structure surrounding both sides of the photo diode region, forming an inner lens at a position corresponding to the photo diode region, forming an auxiliary lens above the inner lens, wherein the auxiliary lens has a same index of refraction as the inner lens, forming a planarized layer on the auxiliary lens, forming a color filter on the planarized layer, and forming a micro-lens on the color filter to correspond to a portion of the inner lens wherein a mask for forming the inner lens is a mask for defining the micro-lens.

These and other exemplary embodiments, aspects, features and advantages of the present invention will become apparent from the following detailed description of exemplary embodiments, which is to be read in connection with the accompanying drawings.

DETAILED DESCRIPTION OF EXEMPLARY EMBODIMENTS

Exemplary embodiments of the present invention will now be described more fully hereinafter below with reference to the accompanying drawings. This invention may, however, be embodied in different forms and should not be construed as limited to the exemplary embodiments set forth herein. Rather, these exemplary embodiments are provided so that this disclosure will be through and complete, and will fully convey the scope of the invention to those skilled in the art.

Figure 1:
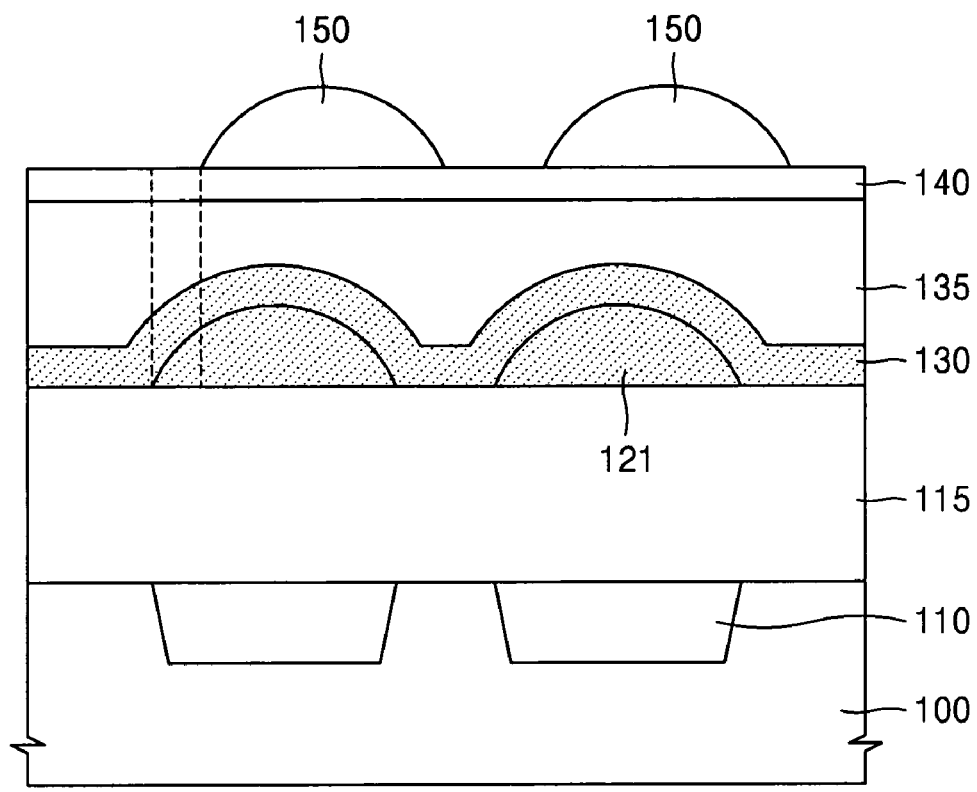
FIG. 1 is a sectional schematic view of a CMOS image device according to an exemplary embodiment of the present invention.

Referring to FIG. 1, a photo diode region 110 is formed in a semiconductor substrate 100. The photo diode region 110 includes a p-n junction. An interlayer insulating layer 115 is formed on the semiconductor substrate in which the photo diode region 110 is formed.

An inner lens 121 is formed on the interlayer insulating layer 115. The inner lens 121 can also be used as a passivation layer protecting the photo diode region 110 from moisture and sodium (Na). In one exemplary embodiment of the present invention, the inner lens 121 is formed of, for example, a silicon nitride (SiN) or a silicon oxynitride (SiON). The inner lens 121 is disposed to correspond to the photo diode region 110. An auxiliary lens 130 is formed on the inner lens 121 and the interlayer insulating layer 115. The auxiliary lens 130 is provided to compensate for the size and curvature of the inner lens 121. The auxiliary lens 130 can be formed of, for example, a material layer having a same index of refraction as that of the inner lens 121. In an exemplary embodiment of the present invention, the auxiliary lens 130 comprises a silicon nitride or a silicon oxynitride.

A planarized layer 135 is formed on the auxiliary layer 130. A color filter 140 is formed on the planarized layer 135. The color filter 140 may be an array of Red, Green, and Blue materials. Alternatively, the color filter 140 can be an array of Yellow, Magenta, and Cyan materials. A micro-lens 150 is disposed on the color filter 140. The micro-lens 150 is disposed to correspond to a portion of the inner lens 121. The micro-lens 150 is shifted by a predetermined distance with respect to the inner lens 121. The micro-lens 150 may be formed of a photosensitive material.

Figure 2A:
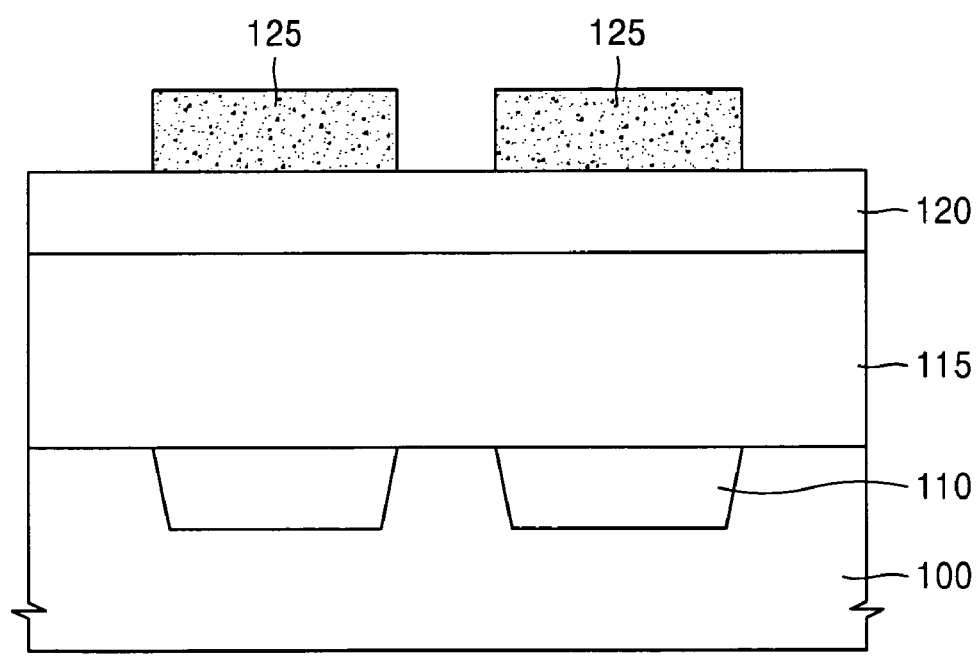
FIGS. 2A through 2C are sectional schematic views illustrating a method of fabricating a CMOS image device according to an exemplary embodiment of the present invention.

Hereinafter, a method of fabricating a CMOS image device will be explained in reference to FIGS. 2A through 2D. Referring to FIG. 2A, impurities are implanted into a semiconductor substrate 100 to form a photo diode region 110. The semiconductor substrate 100 may be a p-type silicon substrate including a p-well (not shown) and an n-well (not shown). Before forming the photo diode region 110 on the semiconductor substrate 100, the semiconductor substrate 100 may have an isolation layer (not shown) and gate electrodes (not shown) of a transistor in a pixel region and a CMOS logic region formed thereon. The photo diode region 110 is provided, for example, by forming a p-type junction region and an n-type junction region. An interlayer insulating layer 115 is formed on the semiconductor substrate 100 having the photo diode region 110 formed therein.

Figure 2B:
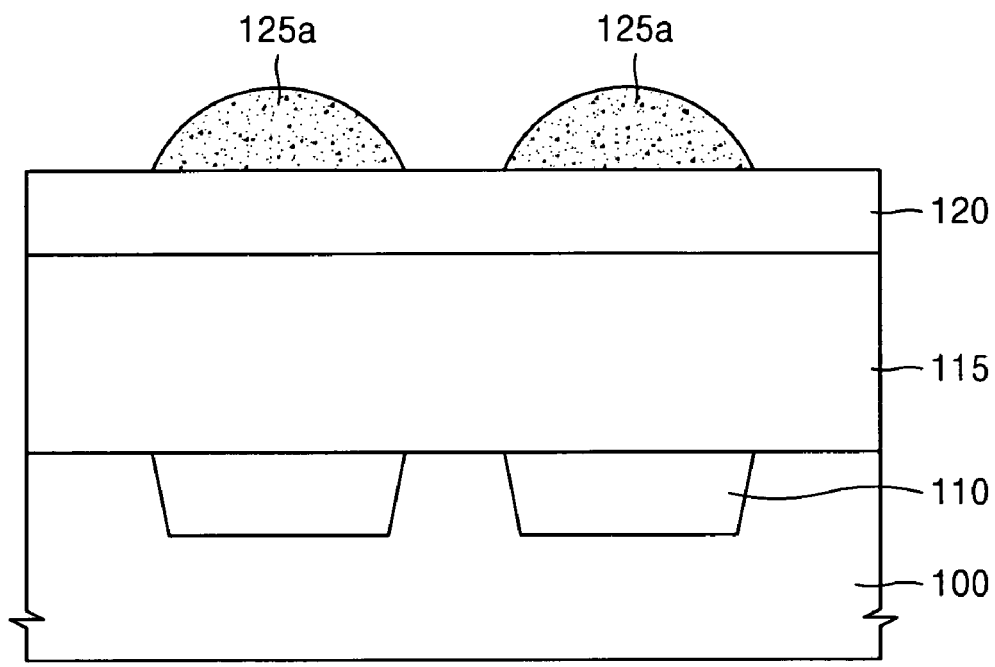
Figure 2C:
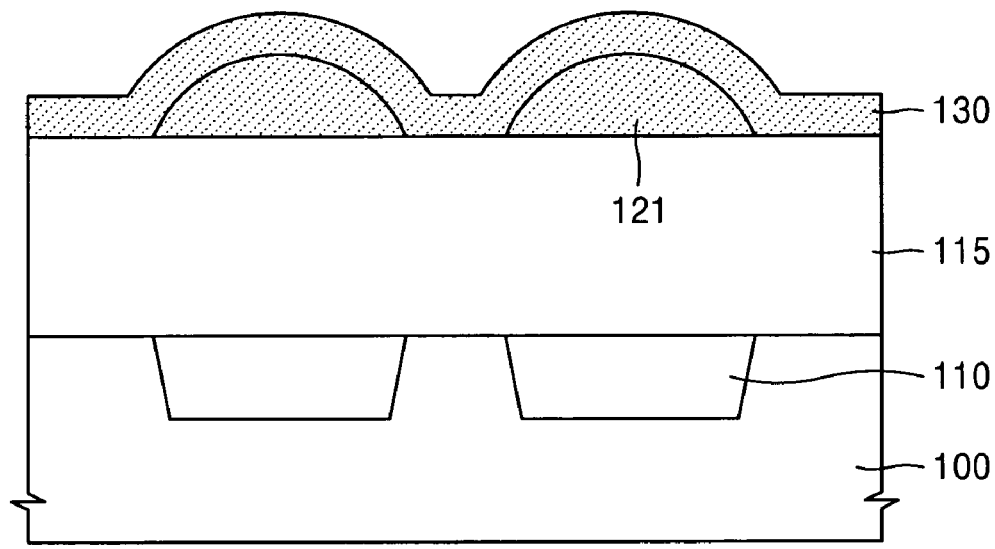

A passivation layer 120 for an inner lens is deposited on the interlayer insulating layer 115. The passivation layer 120 for the inner lens may be formed of, for example, a silicon nitride or a silicon oxynitride. The passivation layer 120 is formed with a thickness of about 5000 Å to about 8000 Å by using, for example, a plasma enhanced chemical vapour deposition (PECVD) method. A photosensitive pattern 125 is formed on the passivation layer 120 by a known photolithography process to define a size of the inner lens. The photosensitive pattern 125 is reflowed at a predetermined temperature to form a curvature on the surface of the photosensitive pattern 125. Thus, a photosensitive pattern 125a having a lens-shaped curvature as shown in FIG. 2B is formed on the passivation layer 120.

Using the photosensitive pattern 125a having a curvature as a mask, the passivation layer 120 under the photosensitive pattern 125a is dry-etched. The passivation layer 120 is etched into a shape of the photosensitive pattern 125a having a curvature by a dry-etch process to form an inner lens 121. The dry-etch process of forming the inner lens 121 can be controlled by a process time. Then, the photosensitive pattern 125a is removed. However, if the dry-etch process of forming the inner lens 121 is dependent only on time, i.e. without an etch stopper under the layer, a shape of the inner lens 121 may be changed depending on process conditions. Then, the inner lens 121 cannot have a desired curvature.

In exemplary embodiments of the present invention, an auxiliary lens 130 is formed on the inner lens 121. The auxiliary lens 130 covers the interlayer insulating layer 115 in which the inner lens 121 is formed. In one exemplary embodiment of the present invention, the auxiliary lens 130 is formed of a layer having good step coverage characteristics so that it can be deposited with a uniform thickness along the curvature of the inner lens 121.

In one exemplary embodiment of the present invention, the auxiliary lens 130 can be formed of a layer having a same index of refraction as that of the inner lens 121. Refraction at the interface between the auxiliary lens 130 and the inner lens 121 can be avoided when light is incident. The auxiliary lens 130 may be formed of a silicon nitride or a silicon oxynitride using, for example, a PECVD method. A thickness of the auxiliary lens 130 may be determined by the size of the inner lens 121. The thickness of the auxiliary lens 130 is, for example, about 2500 Å to about 3500 Å.

Referring again to FIG. 1, a planarized layer 135 is formed on the auxiliary lens 130. A color filter 140 is formed on the planarized layer 135. A photosensitive layer for a micro-lens (not shown) is formed on the color filter 140. A portion of the photosensitive layer is patterned. The patterned photosensitive layer is reflowed at a predetermined temperature to form a micro-lens 150. The micro-lens 150 can be formed at a position, which is offset with respect to the inner lens 121 by a predetermined distance, to collect the incident light even at an oblique angle.

In exemplary embodiments of the present invention, the size and the curvature of the inner lens 121 can be compensated for with the auxiliary lens 130 formed on the surface of the inner lens 121. Since the size of the inner lens 121 is compensated for with the formation of the auxiliary lens 130, an area of a dead zone, i.e., an area where incident light is not collected, is reduced. Thus, the light collection efficiency of the CMOS image device can be improved.

Figure 3:
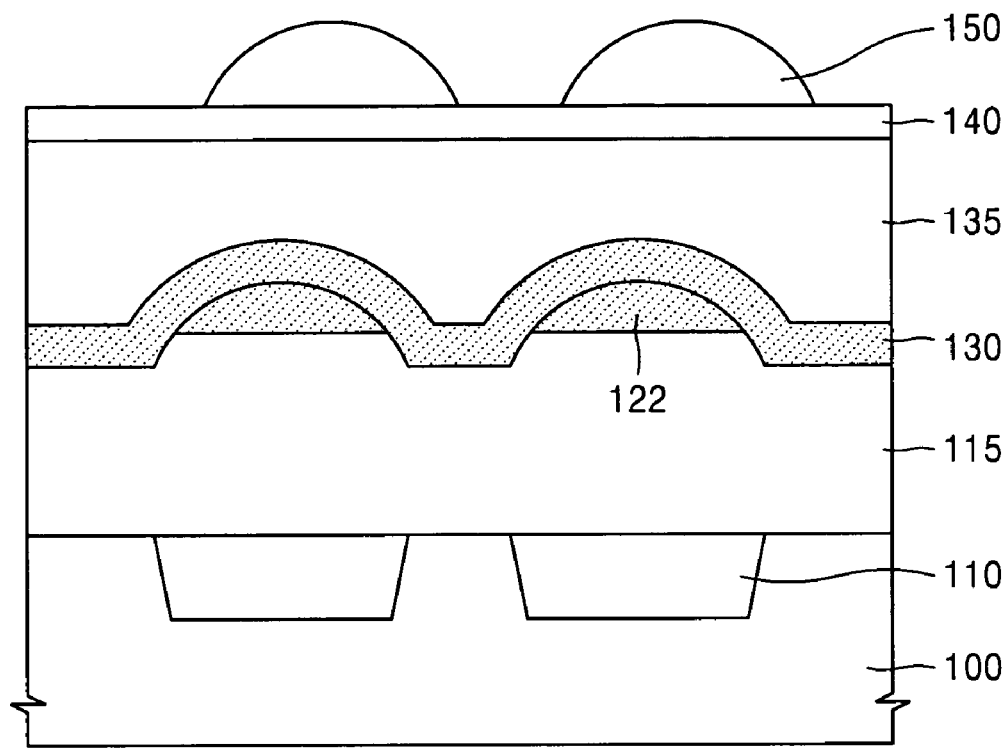
FIG. 3 is a sectional schematic view of a CMOS image device according to another exemplary embodiment of the present invention.

FIG. 3 is a sectional schematic view of a CMOS image device according to another exemplary embodiment of the present invention. As shown in FIG. 3, an interlayer insulating layer 115 is formed on a semiconductor substrate 100 including a photo diode region 110 formed therein. An inner lens 122 is formed on the interlayer insulating layer 115 to correspond to the photo diode region 110. An auxiliary lens 130 is formed on the inner lens 122 and the interlayer insulating layer 115. The auxiliary lens 130 is formed of a layer having a same index of refraction as that of the inner lens 122. The auxiliary lens 130 can compensate for the size of the inner lens 122 and improve a curvature.

In one embodiment of the present invention, the interface between the auxiliary lens 130 and the interlayer insulating layer 115 is formed under the interface between the inner lens 122 and the interlayer insulating layer 115. To increase the curvature of the inner lens 122, the interlayer insulating layer 115 on both sides of the auxiliary lens 130 can be etched down to a predetermined depth. A planarized layer 135, a colorfilter 140, and a micro-lens 150 can be formed on the auxiliary lens 130 in the same way as shown in FIG. 1.

Figure 4A:
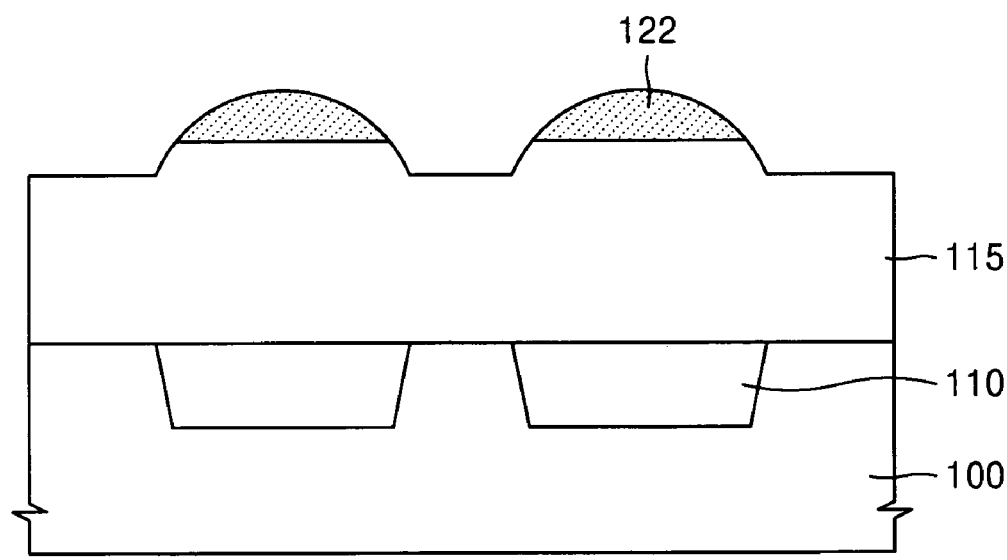
FIGS. 4A and 4B are sectional schematic views illustrating a method of fabricating a CMOS image device according to another exemplary embodiment of the present invention.

A method of fabricating the CMOS image device of FIG. 3 will be described with reference to FIGS. 4A and 4B. As shown in FIG. 4A, an interlayer insulating layer 115 is formed on a semiconductor substrate 100 in which a photo diode region 110 is formed. A passivation layer 120 for an inner lens (FIG. 2A) is deposited to a thickness of about 5000 Å to about 8000 Å on the interlayer insulating layer 115 using, for example, a PECVD method. The passivation layer 120 may be formed of, for example, silicon nitride or silicon oxynitride. A lens-shaped photosensitive pattern (not shown) is formed on the passivation layer 120 as described above. The passivation layer 120 is dry-etched into a shape of the photosensitive pattern to form an inner lens 122.

During the dry-etch process of forming the inner lens 122, an overetch is performed to an extent that the interlayer insulating layer 115 on both sides of the inner lens 122 is partially etched. The overetch is performed by etching the passivation layer 120 exposed by the photosensitive pattern until the exposed passivation layer is completely removed. Then, the photosensitive pattern is removed. The interlayer insulating layer 115 is etched using the remaining passivation layer 120, i.e., the inner lens 122, as a mask, with a predetermined thickness. The size of the inner lens 122 is reduced after the overetch. Furthermore, a curvature of the inner lens 122 is increased.

Figure 4B:
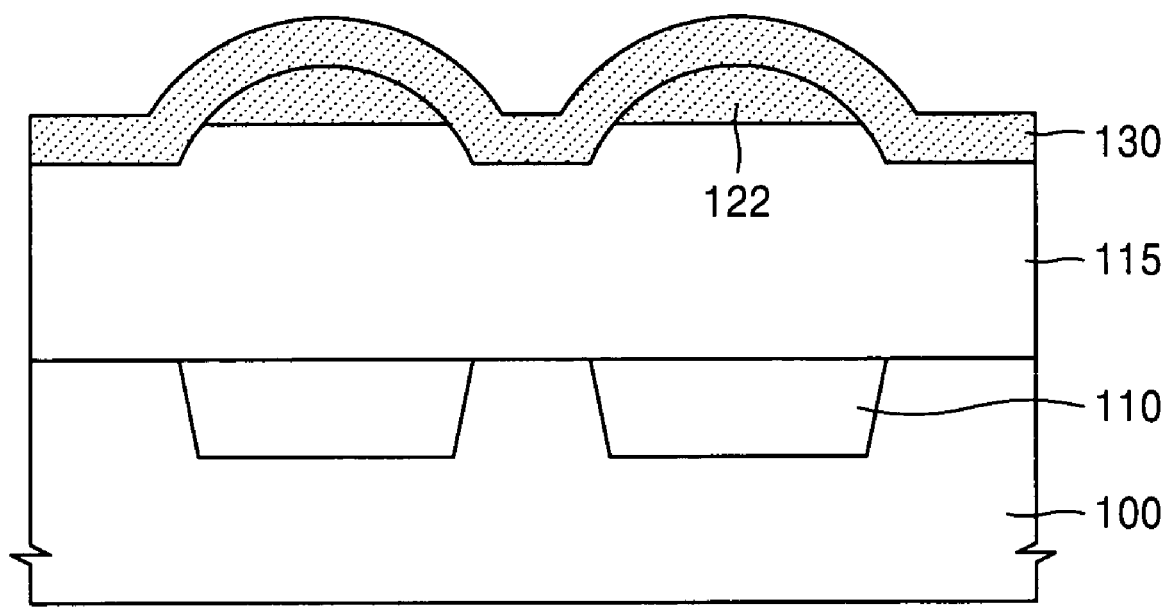

As shown in FIG. 4B, the auxiliary lens 130 is formed on the interlayer insulating layer 115 and the inner lens 122. The auxiliary lens 130 has a same index of refraction as the inner lens 122. The auxiliary lens 130 may be formed of a silicon nitride or a silicon oxy-nitride by, for example, a PECVD method as described above. The auxiliary lens 130 can be formed with a thickness, for example, of about 2500 Å to about 5000 Å.

As depicted in FIG. 3, a planarized layer 135, a color filter 140, and a micro-lens 150 are formed. When etching the interlayer insulating layer 115 on both sides of the inner lens 122, the curvature of the inner lens 122 is increased. The size of the inner lens is increased by the auxiliary lens 130. A dead zone is reduced by the etching of the interlayer insulating layer 115. Therefore, the light collection efficiency of the image device can be improved.

Figure 5:
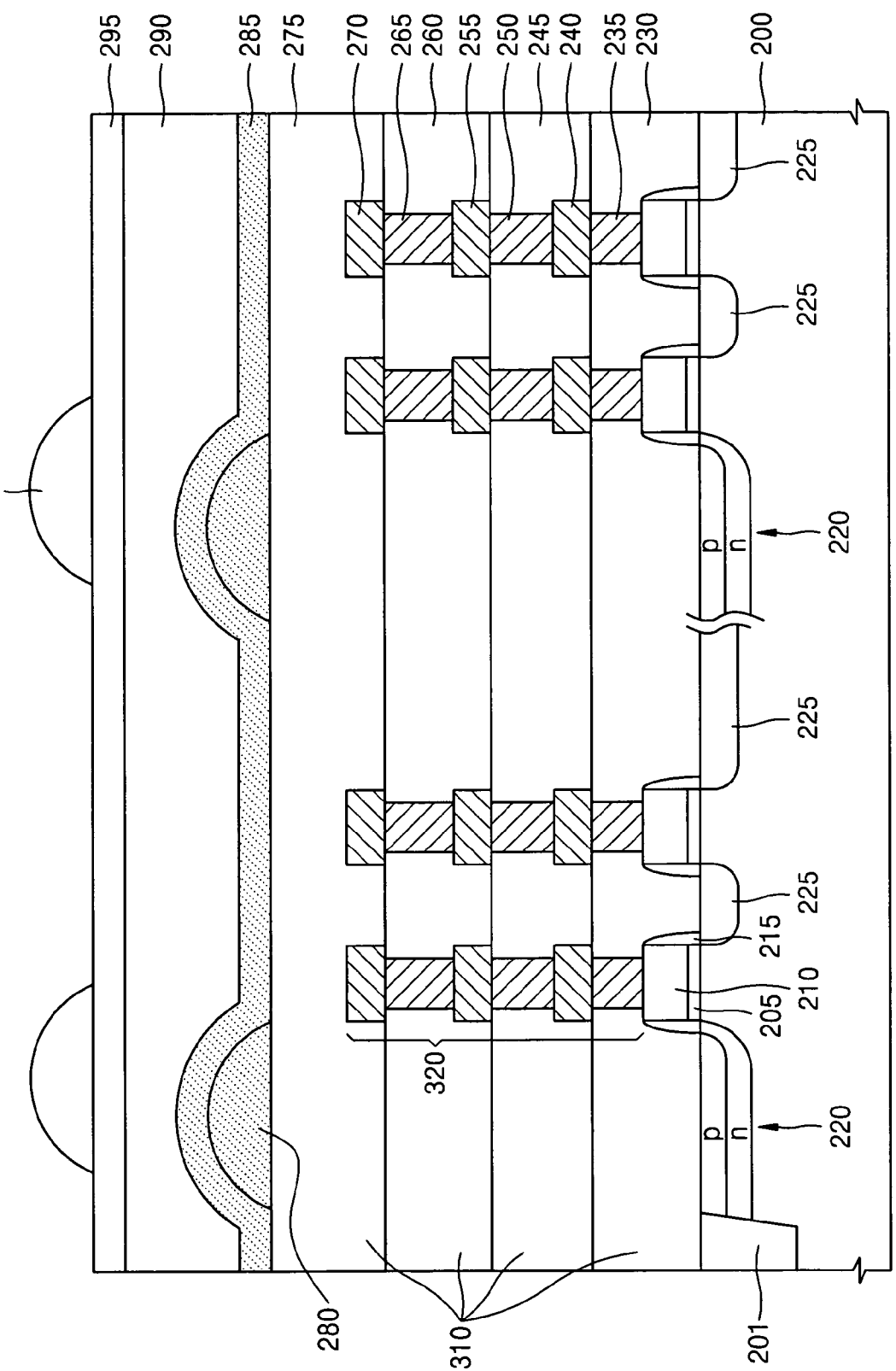
FIGS. 5 and 6 are sectional schematic views of a unit pixel of a CMOS image device according to exemplary embodiments of the present invention.

FIG. 5 is a sectional view of a unit pixel of a CMOS image device according to an exemplary embodiment of the present invention. As depicted in FIG. 5, an isolation layer 201 is formed on a portion of a semiconductor substrate 200 to define an active region. A gate electrode 210 having a gate oxide layer 205 is formed on the semiconductor substrate 200. The gate electrode 210 may be a gate electrode of a transfer transistor, a reset transistor, or a source follower transistor. A unit pixel of the CMOS image device includes the transfer transistor.

Spacers 215 are formed on the both sidewalls of the gate electrode 210 by a conventional method. A photo diode region 220 including a p-n junction is formed on one side of the gate electrode 210 of the transfer transistor. N-type impurities are implanted into an active region in the both sides of the gate electrode 210 except the photo diode region 220, to form a junction region 225.

An interlayer insulating layer 310 including a metal interconnection structure 320 is formed on the semiconductor substrate 200. The photo diode region 220 and the transistor are formed on the semiconductor substrate 200. The interlayer insulating layer 310 includes at least one insulating layer. The metal interconnection structure 320 includes at least one layer of metal interconnection. The metal interconnection structure 320 may be disposed at both sides of the photo diode region 220. Alternatively, the metal interconnection structure 320 may be disposed to encompass the photo diode region. The metal interconnection structure may function as a light shield.

A detailed description of a method of forming the interlayer insulating layer 310 and the metal interconnection structure 320 will be made as follows. A first interlayer insulating layer 230 is deposited on the semiconductor substrate 200. A first contact stud 235 is formed in the first interlayer insulating layer 230. The contact stud 235 is formed to contact the gate electrode 210 as shown in the drawing. Further, although not depicted in the drawing, a contact stud contacting the junction region 225 is also formed in the first interlayer insulating layer 230.

A first metal interconnection 240 is formed on the first interlayer insulating layer 230. The first metal interconnection 240 contacts each of the first contact studs 235 and a second interlayer insulating layer 245. The second interlayer insulating layer 245 is formed on the first interlayer insulating layer 230 on which the first metal interconnection 240 is formed. Second contact studs 250 are formed in the second interlayer insulating layer 245, and contact the first metal interconnection 240. A second metal interconnection 255 is formed on the second interlayer insulating layer 245, and contacts the second contact studs 250. A third interlayer insulating layer 260 is formed on the second metal interconnection 255. Third contact studs 265 are formed in the third interlayer insulating layer 260, and contact the second metal interconnection 255. A third metal interconnection 270 is formed to contact the third contact studs 265. A fourth interlayer insulating layer 275 is formed on the third metal interconnection 270.

An inner lens 280 is formed on the fourth interlayer insulating layer 275 to correspond to the photo diode region 220. The inner lens 280 is formed of a passivation layer using a lens-shaped photosensitive pattern as described above. An auxiliary lens 285 is formed on the fourth interlayer insulating layer 275 including the inner lens 280 formed thereon. The auxiliary lens 285 has a same index of refraction as that of the inner lens 280. The auxiliary lens 285 may be formed of the same material as the inner lens 280.

Figure 6:
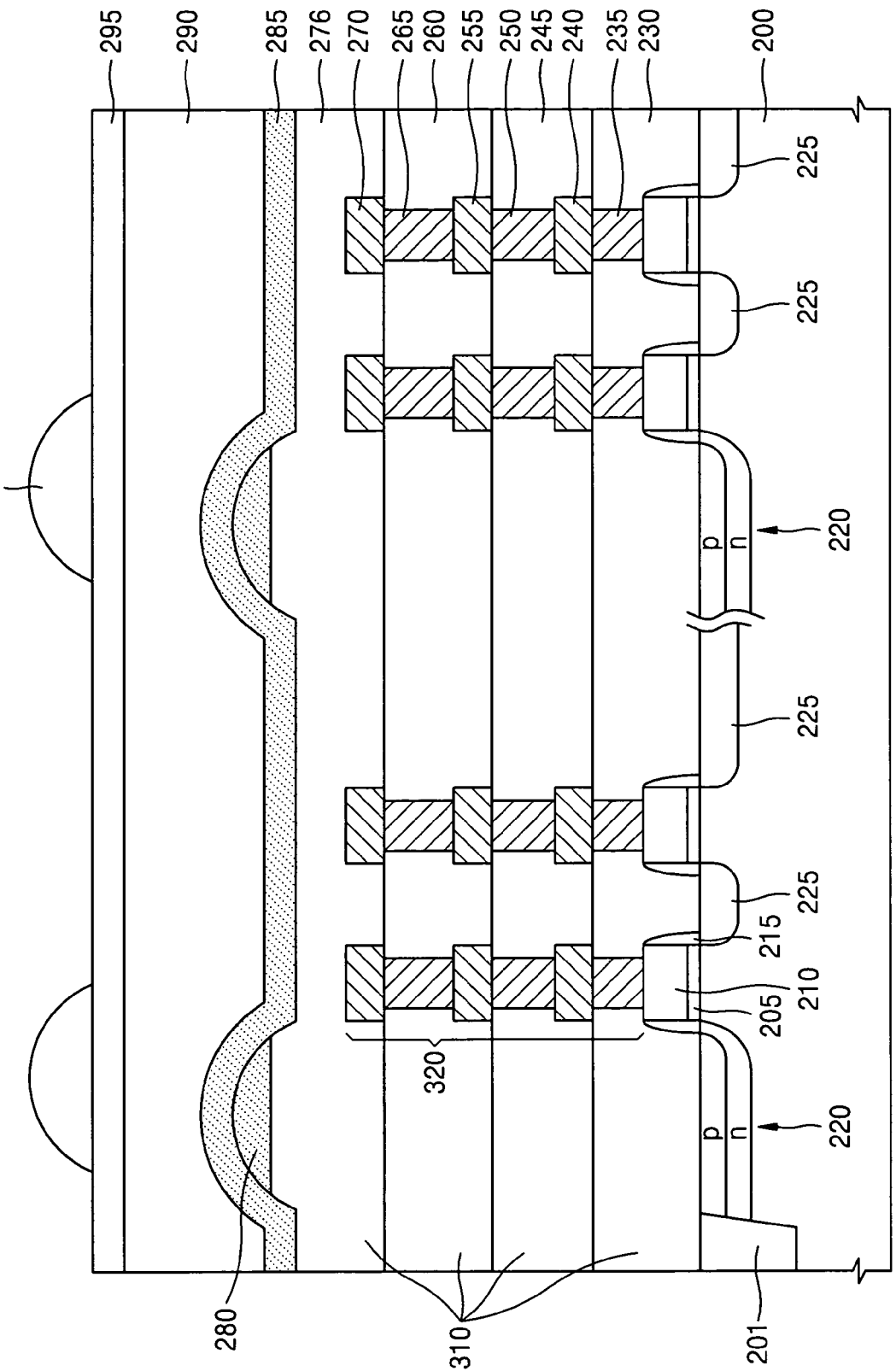

Further, as shown in FIG. 6, a fourth interlayer insulating layer 276, disposed at both sides of the inner lens 280, can be etched down to a predetermined thickness to further increase the curvature of the inner lens 280. Then, a planarized layer 290 and a color filter 295 are formed on the auxiliary lens 285. A micro-lens 300 is formed by a conventional method on the color filter 295. As described above, the micro-lens 300 is formed at a position which is offset with respect to the inner lens 280 by a predetermined distance.

Therefore, according to exemplary embodiments of the present invention, an auxiliary lens is provided on the surface of an inner lens. The auxiliary lens is formed of a layer having a same index of refraction as that of the inner lens. Since the auxiliary lens is formed along the curvature of the inner lens, the size and the curvature of the inner lens can be compensated for. As described above, since the size and the curvature of the inner lens can be compensated for, the area of a dead zone is further reduced, thereby improving light collection efficiency of the CMOS image device.

Although exemplary embodiments have been described herein with reference to the accompanying drawings, it is to be understood that the present invention is not limited to such exemplary embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A CMOS image device comprising:
   a semiconductor substrate having a photo diode region formed therein;
   an inner lens formed at a position corresponding to the photo diode region on the semiconductor substrate; and
   an auxiliary lens formed on the inner lens along a surface of the inner lens,
   wherein the auxiliary lens has a same index of refraction as the inner lens, and the auxiliary lens extends beyond the photo diode region.

2. The CMOS image device of claim 1, further comprising a micro-lens formed above the inner lens to correspond to at least a portion of the inner lens.

3. The CMOS image device of claim 1, further comprising an interlayer insulating layer interposed between the semiconductor substrate and the inner lens.

4. The CMOS image device of claim 1, wherein the inner lens and the auxiliary lens includes a passivation material for blocking moisture and sodium (Na).

5. A CMOS image device comprising:
   a semiconductor substrate having a photo diode region formed therein;
   an interlayer insulating layer formed on the semiconductor substrate;
   an inner lens formed on the interlayer insulating layer to correspond to the photo diode region;
   an auxiliary lens formed on the inner lens and the interlayer insulating layer,
   wherein the auxiliary lens has a same index of refraction as the inner lens; and
   a micro-lens formed on the auxiliary lens to correspond to at least a portion of the inner lens,
   wherein the auxiliary lens extends beyond the photo diode region.

6. The CMOS image device of claim 5, further comprising a metal interconnection structure formed in the interlayer insulating layer on both sides of the photo diode region for shielding light.

7. The CMOS image device of claim 5, wherein a step difference exists between an interface of the inner lens and the interlayer insulating layer, and an interface of the auxiliary lens and the interlayer insulating layer.

8. The CMOS image device of claim 5, wherein the inner lens comprises a silicon nitride or a silicon oxynitride.

9. The CMOS image device of claim 5, further comprising a planarized layer and a color filter layer formed between the auxiliary lens and the micro-lens.

10. A method of fabricating a CMOS image device comprising:
    forming a photo diode region on a portion of a semiconductor substrate;
    forming an interlayer insulating layer on the semiconductor substrate;
    forming an inner lens on a portion of the interlayer insulating layer corresponding to the photo diode region; and
    forming an auxiliary lens on the inner lens,
    wherein the auxiliary lens comprises a layer having a same index of refraction as the inner lens,
    wherein the auxiliary lens extends beyond the photo diode region.

11. The method of claim 10, wherein the operation of forming the inner lens comprises:
    forming a passivation layer on the interlayer insulating layer;
    forming a photosensitive pattern on the passivation layer, the photosensitive pattern having a curvature; and
    dry-etching the passivation layer into a shape of the photosensitive pattern having the curvature.

12. The method of claim 11, wherein the operation of dry-etching the passivation layer into a shape of the photosensitive pattern having the curvature comprises:
    dry-etching until the passivation layer exposed on both sides of the photosensitive pattern is removed; and
    etching the exposed interlayer insulating layer using the remaining passivation layer as a mask.

13. The method of claim 12, wherein the passivation layer is a silicon nitride layer or a silicon oxynitride layer formed by a PECVD method.

14. The method of claim 13, wherein the passivation layer is formed with a thickness of about 5000 Å to about 8000 Å.

15. The method of claim 11, wherein the operation of forming the photosensitive pattern having a curvature comprises:
    forming a photosensitive pattern on the passivation layer to correspond to the photo diode region; and
    reflowing the photosensitive pattern.

16. The method of claim 10, wherein the auxiliary lens comprises a silicon nitride or a silicon oxynitride formed by a PECVD method.

17. The method of claim 16, wherein the layer of the auxiliary lens is formed with a thickness of about 2500 Å to about 3500 Å.

18. The method of claim 10, further comprising:
    forming a planarized layer on the auxiliary lens;
    forming a color filter on the planarized layer; and
    forming a micro-lens on the color filter to correspond to a portion of the inner lens.

19. The method of claim 18, wherein the operation of forming the micro-lens comprises:
    depositing a photosensitive layer on the color filter to correspond to a portion of the inner lens; and
    reflowing the photosensitive layer.

20. A method of fabricating a CMOS image device, comprising:
    forming a photo diode region on a portion of a semiconductor substrate;
    forming an interlayer insulating layer on the semiconductor substrate,
    wherein the interlayer insulating layer has a metal interconnection structure surrounding both sides of the photo diode region;
    forming an inner lens at a position corresponding to the photo diode region;
    forming an auxiliary lens above the inner lens, wherein the auxiliary lens has a same index of refraction as the inner lens;
    forming a planarized layer on the auxiliary lens;
    forming a color filter on the planarized layer; and
    forming a micro-lens on the color filter, to correspond to a portion of the inner lens wherein a mask for forming the inner lens is a mask for defining the micro-lens.

* * * * *